United States Patent
Park et al.

(10) Patent No.: US 8,922,012 B2
(45) Date of Patent: Dec. 30, 2014

(54) INTEGRATED CIRCUIT CHIP AND FLIP CHIP PACKAGE HAVING THE INTEGRATED CIRCUIT CHIP

(75) Inventors: Jin-Woo Park, Cheonan-si (KR); Eun-Chul Ahn, Yongin-si (KR); Dong-Kil Shin, Hwaseong-si (KR); Sun-Won Kang, Seongnam-si (KR); Jong-Ho Lee, Hwaseong-si (KR)

(73) Assignee: SAMSUNG Electronics Co., Ltd., Suwon-si (KR)

( * ) Notice: Subject to any disclaimer, the term of this patent is extended or adjusted under 35 U.S.C. 154(b) by 0 days.

(21) Appl. No.: 12/894,540

(22) Filed: Sep. 30, 2010

(65) Prior Publication Data

US 2011/0079897 A1    Apr. 7, 2011

(30) Foreign Application Priority Data

Oct. 1, 2009    (KR) ........................ 10-2009-0093968

(51) Int. Cl.
| | |
|---|---|
| *H01L 23/48* | (2006.01) |
| *H01L 23/52* | (2006.01) |
| *H01L 29/40* | (2006.01) |
| *H01L 23/00* | (2006.01) |
| *H01L 23/498* | (2006.01) |

(52) U.S. Cl.
CPC .......... *H01L 24/06* (2013.01); *H01L 23/49816* (2013.01); *H01L 24/12* (2013.01); *H01L 24/11* (2013.01); *H01L 24/05* (2013.01);

(Continued)

(58) Field of Classification Search
CPC ... H01L 24/12; H01L 24/16; H01L 23/49816; H01L 24/06; H01L 2224/16227; H01L 24/14
USPC ........... 257/778, 780, 737, 738, 784, E23.021
See application file for complete search history.

(56) References Cited

U.S. PATENT DOCUMENTS 6,596,560 B1 * 7/2003 Hsu .............................. 438/108
6,750,547 B2 * 6/2004 Jeung et al. ................... 257/778

(Continued)

FOREIGN PATENT DOCUMENTS

| JP | 08-139128 | 5/1996 |
|---|---|---|
| JP | 09-129646 | 5/1997 |
| WO | 02/01637 | 1/2002 |

OTHER PUBLICATIONS

Chinese Office Action dated Feb. 27, 2014 issued in CN Application No. 201010502594.8.

(Continued)

*Primary Examiner* — Shouxiang Hu
(74) *Attorney, Agent, or Firm* — Ellsworth IP Group PLLC

(57) ABSTRACT

In an integrated circuit (IC) chip and a flip chip package having the same, no wiring line is provided and the first electrode pad does not make contact with the wiring line in a pad area of the IC chip. Thus, the first bump structure makes contact with the first electrode regardless of the wiring line in the pad area. The second electrode pad makes contact with the wiring line in a pseudo pad area of the IC chip. Thus, the second bump structure in the pseudo pad area makes contact with an upper surface of the second electrode at a contact point(s) spaced apart from the wiring line under the second electrode.

11 Claims, 8 Drawing Sheets

(52) U.S. Cl.
CPC ............. *H01L 2224/13099* (2013.01); *H01L 2924/01013* (2013.01); *H01L 2924/01015* (2013.01); *H01L 2924/01029* (2013.01); *H01L 2924/01033* (2013.01); *H01L 2924/01047* (2013.01); *H01L 2924/01078* (2013.01); *H01L 2924/01082* (2013.01); *H01L 2924/14* (2013.01); *H01L 2924/19041* (2013.01); *H01L 2224/05569* (2013.01); *H01L 2224/05011* (2013.01); *H01L 24/03* (2013.01); *H01L 24/13* (2013.01); *H01L 2224/02125* (2013.01); *H01L 2224/03464* (2013.01); *H01L 2224/05018* (2013.01); *H01L 2224/05558* (2013.01); *H01L 2224/05655* (2013.01); *H01L 2224/06051* (2013.01); *H01L 2224/13022* (2013.01); *H01L 2224/131* (2013.01); *H01L 2224/13116* (2013.01); *H01L 2224/1403* (2013.01); *H01L 2924/01006* (2013.01); *H01L 2924/014* (2013.01); *H01L 2224/05572* (2013.01); *H01L 2224/16227* (2013.01); *H01L 2224/73204* (2013.01); *H01L 2924/00013* (2013.01); *H01L 2224/05124* (2013.01); *H01L 2224/05147* (2013.01); *H01L 2224/16225* (2013.01)

USPC ........... 257/738; 257/737; 257/778; 257/784; 257/E23.021

(56) References Cited

U.S. PATENT DOCUMENTS

| | | | |
|---|---|---|---|
| 6,815,327 | B2 | 11/2004 | Farnworth |
| 7,091,121 | B2 * | 8/2006 | Horng ..................... 438/612 |
| 7,560,810 | B2 | 7/2009 | Yamaguchi |
| 7,855,136 | B2 | 12/2010 | Takahira |
| 2002/0185749 | A1 | 12/2002 | Farnworth |
| 2004/0166660 | A1 | 8/2004 | Yamaguchi |
| 2005/0170630 | A1 | 8/2005 | Kuo et al. |
| 2005/0269684 | A1 * | 12/2005 | Baek et al. ............... 257/691 |
| 2006/0131748 | A1 * | 6/2006 | Seshan ..................... 257/737 |
| 2007/0200239 | A1 | 8/2007 | Su |
| 2008/0042259 | A1 * | 2/2008 | Yamaguchi ................. 257/700 |
| 2008/0124837 | A1 | 5/2008 | Takahira |
| 2009/0014869 | A1 | 1/2009 | Vrtis et al. |
| 2009/0236741 | A1 | 9/2009 | Huang et al. |

OTHER PUBLICATIONS

Chinese Office Action dated Aug. 5, 2014 issued in CN Application No. 201010502594.8.

* cited by examiner

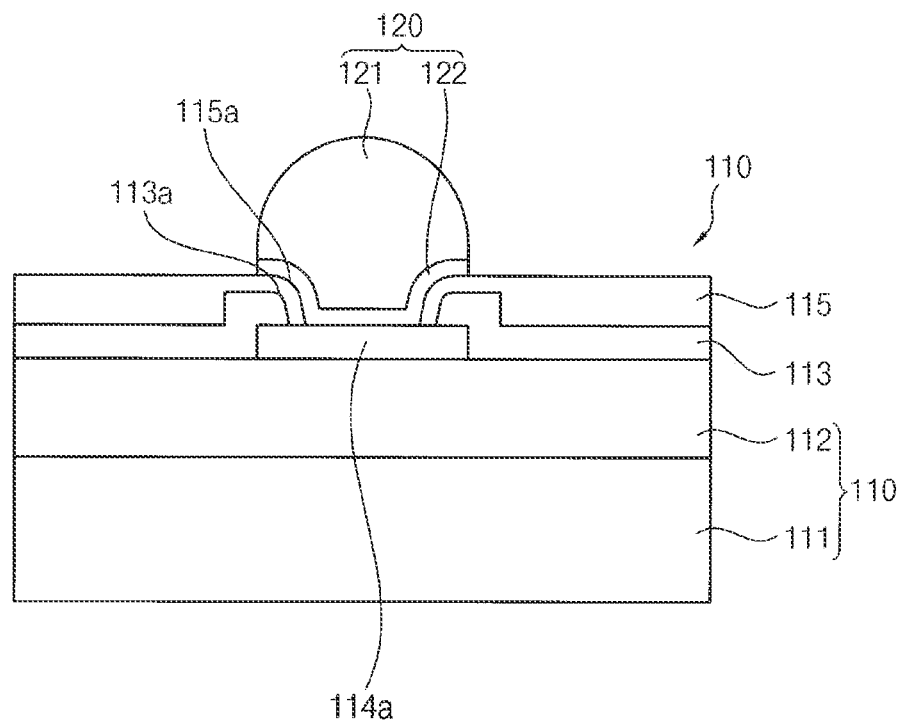
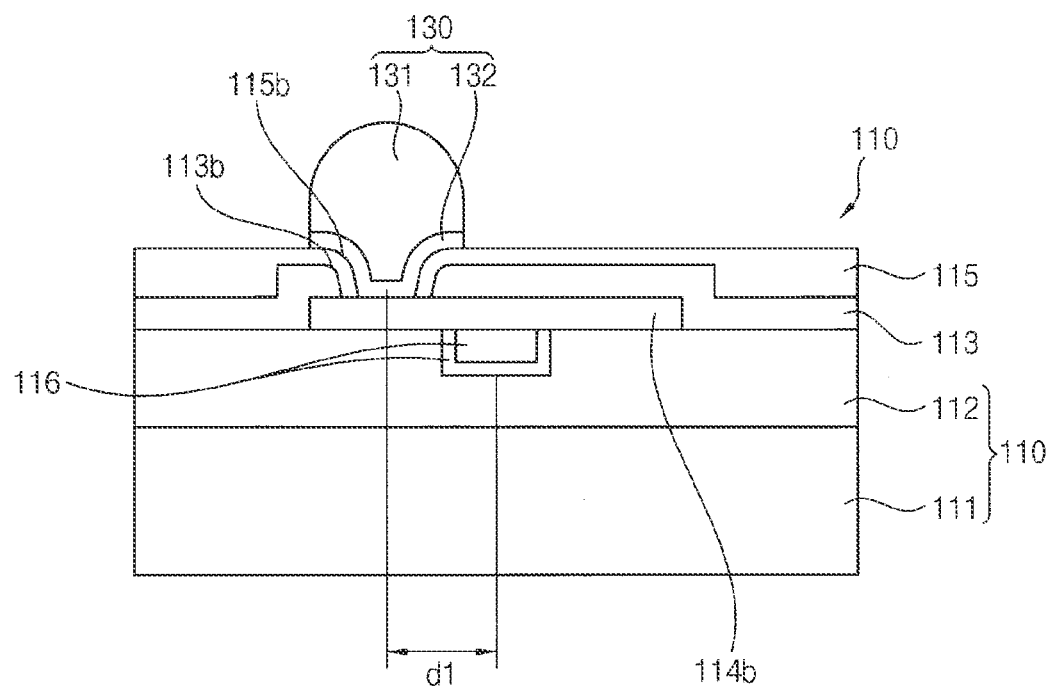

INTEGRATED CIRCUIT CHIP AND FLIP CHIP PACKAGE HAVING THE INTEGRATED CIRCUIT CHIP

CROSS-REFERENCE TO RELATED APPLICATIONS

This application claims priority under 35 U.S.C. §119(a) from Korean Patent Application No. 10-2009-0093968, filed on Oct. 1, 2009, in the Korean Intellectual Property Office, the disclosure of which is incorporated herein in its entirety by reference.

BACKGROUND

1. Field of the Invention

Example embodiments of the present general inventive concept relate to a semiconductor device and a method of manufacturing the same, and more particularly, to an integrated circuit (IC) chip including a bump structure and a method of manufacturing the same and a flip chip package having the IC chip and a method of manufacturing the same.

2. Description of the Related Art

Information telecommunication (IT), computer, and display industries have been rapidly developed in recent times and thus electronic components for the IT equipment, the computer systems, and the display apparatuses usually require much higher capacity with much lower power consumption together with requirements of lightness, thinness, shortness, and smallness.

For those reasons, various researches have been conducted in a fabrication process for fabricating an integrated circuit (IC) device and a package process for packaging the IC device in the electronic components. The fabrication process has been developed for increasing an integration degree of the IC device and decreasing power consumption for stably operating the IC device, and the package process has been developed for mounting the IC devices onto a (mounting) board at high density.

In a conventional package process, semiconductor chips fabricated through various unit processes are mounted onto a board in such a way that the semiconductor chips are electrically connected to external electric terminals or devices, and the inside of the semiconductor chips are protected from external environments. For example, a dual inline package process, a small outline package process, a quad flat package process, and a ball grid array technology have been widely suggested for packaging the semiconductor chips onto the board. Recently, a chip scaled package (CSP) process and a direct chip attach (DCA) technology have been suggested in view of the recent requirements of lightness, thinness, shortness and smallness.

A flip chip bonding technology has been widely used for high density packaging of the IC chips onto the board. According to the conventional flip chip bonding technology, the semiconductor chip is usually flipped and the electrode pad of the chip faces the mounting board, and then the IC chip and the board are electrically and mechanically bonded to each other.

Particularly, the electrode pad of the IC chip is connected to a terminal of the mounting board by a metallic connector such as a bump in the conventional flip chip bonding technology, and thus the IC chip and the mounting board are electrically and mechanically connected to each other just by the bump. Therefore, the flip chip bonding technology has strong advantages in that a signal path through which electrical signals travel between the IC chips and the external electric terminals as compared with a wire bonding technology. Thus, a flip chip package in which the IC chips are bonded to the board by the flip chip bonding technology has superior operation characteristics as compared with a wire bonding package in which the IC chips are bonded to the board by the wire bonding technology.

The electrode pad of the IC chip is usually positioned in a pad area of the IC chip and metal wirings of the IC chip are electrically connected to the electrode pad. For example, when the pad area is formed in a central region of the IC chip, a plurality of the electrode pads are arranged in the central region of the IC chip and a plurality of conductive structures for integrated circuits are arranged at both side portions of the electrode pads. The conductive structures and the electrode pads are electrically connected to each other by a wiring, respectively, and thus electrical signals are transferred between the conductive structure and the electrode pad or the conductive structure is electrically grounded to the earth.

A supplemental electrode pad is supplementary used in the flip chip package together with the electrode pad recently. The supplemental electrode pad is positioned over the wirings of the IC chip separated from the pad area of the IC chip in order that an exterior power can be directly applied to the IC chip without passing through the electrode pads. For example, a cell in an area of the IC chip distant from the pad area or another cell of the IC chip in which the power may be consumed relatively high may be directly connected to an exterior power source without passing through the electrode pad, to thereby improve the performance of the flip chip package without any volume increase.

However, there have been problems of process damage to the wirings of the IC chip and mechanical fracture of the flip chip package due to stress concentration to the wirings of the IC chip, since the supplementary electrode pads are positioned over the wirings of the IC chip contrary to the main electrode pads that are arranged in the pad area of the IC chip.

Particularly, when the wiring of the IC chip itself is used as the supplementary electrode pad and a bump structure of the flip chip structure is formed on the wiring, mechanical stresses may be concentrated to the wiring of the IC chip in the process for forming the bump structure. The stress concentration may generate cracks on a surface of the wiring and a peeling failure against the wiring.

SUMMARY

Accordingly, there is still a need for an improved manufacturing process in which the bump structure is formed on the supplementary electrode pad without any damage to the wirings under the supplementary electrode pad.

Example embodiments of the present general inventive concept provide an integrated circuit device including a bump structure on a supplementary electrode pad without stress concentration to wirings under the supplementary electrode, and a method of manufacturing the integrated circuit device.

Additional features and utilities of the present general inventive concept will be set forth in part in the description which follows and, in part, will be obvious from the description, or may be learned by practice of the present general inventive concept.

Exemplary embodiments of the present general inventive concept also provide a flip chip package including the above integrated circuit device and a method of manufacturing the flip chip package.

According to example embodiments of the present general inventive concept, there is provided an integrated circuit (IC) chip including an integrated circuit (IC) device, an electrode pad arranged on the IC device, a passivation pattern covering the electrode pattern and a bump structure arranged on the passivation pattern. The IC device may include a plurality of conductive structures stacked on a substrate and a plurality of wiring lines electrically connected to the conductive structure, and the IC device may be divided into a first area in which no wiring lines are arranged and a second area in which the wiring lines are arranged. The electrode pad may be arranged on the IC device and may be electrically communicated with the conductive structures through the wiring line. The electrode pad may include a first pad arranged in the first area of the IC device and electrically connected with the wiring line and a second pad arranged in the second area of the IC device and to make contact with the wiring line. The passivation pattern may cover the electrode pattern and include a first passivation opening through which the first pad is partially exposed and at least a second passivation opening through which the second pad is partially exposed. For example, the second passivation opening may be spaced apart from the wiring line below the second pad. The bump structure may be arranged on the passivation pattern and may include a first bump structure connected with the first pad through the first passivation opening and a second bump structure connected with the second pad through the second passivation opening.

In exemplary embodiments of the present general inventive concept, the second passivation opening may include a first split passivation opening spaced apart from the wiring line by a first distance in a first direction and a second split passivation opening spaced apart from the wiring line by a second distance in a second direction opposite to the first direction, so that the second bump structure may be connected with the second pad through the first and second split passivation openings, respectively. In contrast, the first direction may be substantially identical to the second direction, so that the first and second split passivation openings may be spaced apart from the wiring line in a same direction.

In example embodiments of the present general inventive concept, the wiring lines may include a plurality of power lines to apply a driving power to the conductive structures and a plurality of ground lines to electrically ground the wiring lines.

In example embodiments of the present general inventive concept, the IC chip may further include a buffer pattern arranged on the passivation pattern. The buffer pattern may include a first buffer opening through which the first pad is partially exposed and at least a second buffer opening through which the second pad is partially exposed. For example, the buffer pattern may comprise one of nitride, polyimide and epoxy resin.

In example embodiments of the present general inventive concept, the bump structure may include a conductive bump to make contact with a mounting substrate and an under-barrier metal (UBM) layer interposed between the conductive bump and the electrode pad and to bond the conductive bump to the electrode pad. The UBM layer may include a bi-layer having a barrier layer to prevent diffusion of the bump structure into the electrode pad and a metal layer to increase a bonding force between the barrier layer and the bump structure. In contrast, the UBM layer may include a nickel layer coated on the electrode pad by an electroless plating process.

According to example embodiments of the present general inventive concept, there is provided a flip chip package including a mounting substrate, an integrated circuit (IC) chip, an exterior terminal and an under-filling layer. The mounting substrate may include a body in which a mounting circuit pattern is arranged, an upper contact pad on an upper surface of the body and a lower contact pad on a lower surface of the body. The mounting circuit pattern may be electrically connected to both of the upper and lower contact pad. The IC chip may make contact with the upper contact pad of the mounting substrate by first and second bump structures. The first bump structure of the IC chip may be arranged in a pad area in which no wiring line is arranged and the second bump structure of the IC chip may be arranged in a pseudo pad area in which a wiring line is arranged. The exterior terminal may be connected to the lower contact pad and the under-filling layer may fill up a gap space between the mounting substrate and the IC chip.

According to example embodiments of the present general inventive concept, there is provided a method of manufacturing the above-mentioned IC chip. An integrated circuit (IC) device may be formed on a semiconductor substrate such as a wafer. The integrated circuit (IC) device may include a plurality of conductive structures stacked on the substrate and a plurality of wiring lines electrically connected to the conductive structure. The IC device may be divided into a first area in which no wiring line is arranged and a second area in which the wiring lines are arranged. An electrode pad may be formed on the IC device such that the electrode pad may be electrically communicated with the conductive structures through the wiring line. The electrode pad may include a first pad arranged in the first area of the IC device and electrically connected with the wiring line and a second pad arranged in the second area of the IC device and to make contact with the wiring line. A passivation pattern may be formed on the electrode pattern such that the passivation pattern may include a first passivation opening through which the first pad may be partially exposed and at least a second passivation opening through which the second pad may be partially exposed. The second passivation opening may be spaced apart from the wiring line below the second pad. A bump structure may be formed on the passivation pattern such that a first bump structure may be connected with the first pad through the first passivation opening and a second bump structure may be connected with the second pad through the second passivation opening.

In example embodiments of the present general inventive concept, the first area may be prepared along a central portion of the IC device and the second area may be prepared at both side portions of the IC device including a cell area and a peripheral area of the IC device, so that the first pads may be regularly formed in a line in the first area and the second pads may be randomly formed in the second area in such a manner that the wiring line in the second area is covered with the second pad.

In example embodiments of the present general inventive concept, the passivation pattern may be exemplarily formed where a passivation layer may be formed on the substrate on which the electrode pad is formed and a mask pattern may be formed on the passivation layer. The mask pattern may include first and second mask openings through which the passivation layer may be partially exposed correspondently to the first and second pads, respectively. The second mask opening may be spaced apart from the wiring line underlying the second pad. The passivation layer may be removed from the substrate by an etching process using the mask pattern as an etching mask, to thereby form the first passivation opening through which the first pad may be partially exposed and the second passivation opening is spaced apart from the wiring line and through which the second pad may be partially exposed.

In example embodiments of the present general inventive concept, the second mask opening may include a first mask split opening spaced apart from the wiring line by a first distance in a first direction and a second mask split opening spaced apart form the wiring line by a second distance in a second direction opposite to the first direction, so that the second passivation opening may be formed into first and second split passivation openings that are spaced apart from the wiring line and symmetrical to each other with respect to the wiring line.

In example embodiments of the present general inventive concept, the second direction may be substantially identical to the first direction, so that the second passivation opening may be formed into first and second split passivation openings that are spaced apart from the wiring line in a same direction.

In example embodiments of the present general inventive concept, a buffer pattern may be further formed on the passivation pattern. The buffer pattern may include first and second buffer openings corresponding to the first and second passivation openings, respectively, so that the first pad may be partially exposed through the first passivation opening and the first buffer opening and the second pad may be partially exposed through the second passivation opening and the second buffer opening.

In example embodiments of the present general inventive concept, the bump structure may be exemplarily formed on the buffer pattern, where a preliminary under-barrier metal (UBM) layer may be formed on the buffer pattern conformal with the first and second buffer openings, so that the first and second pads may make contact with the preliminary UBM layer in the first and second buffer openings, respectively. A mask pattern may be formed on the preliminary UBM layer. The mask pattern may include openings through which the first and second buffer openings are connected and first and second preliminary bump structures may be formed in the first and second buffer openings and the mask openings. The mask pattern and the preliminary UBM layer under the mask pattern may be removed from the buffer pattern, to thereby form first and second UBM layers in the first and second buffer openings, respectively. A reflow process may be performed to the preliminary bump structure, to thereby form the first and second bump structures on the first and second UBM layers, respectively.

In example embodiments of the present general inventive concept, the first and second preliminary bump structures may be formed by an electroplating process using the mask pattern as a plating mask. The first and second preliminary UBM layers may be coated on the buffer pattern by an electroless plating process using nickel.

According to example embodiments of the present general inventive concept, there is provided a method of manufacturing a flip chip package. A mounting substrate may be prepared for manufacturing the flip chip package. The mounting substrate may include a body in which a mounting circuit pattern is arranged, an upper contact pad on an upper surface of the body and a lower contact pad on a lower surface of the body. The mounting circuit pattern may be electrically connected to both of the upper and lower contact pad. The upper contact pad of the mounting substrate may be bonded to first and second bump structures of an integrated circuit (IC) chip. The IC chip may include a plurality of conductive structures, a plurality of wiring lines to drive the conductive structures and first and second electrode pads to transfer signals. The first bump structure may be arranged in a first area of the IC chip in which the wiring lines may be electrically connected to the first electrode pad. The second bump structure may be arranged in a second area of the IC chip in which the wiring lines may make contact with the second electrode pad. An exterior terminal may be connected to the lower contact pad of the mounting substrate and an under-filling layer may be filled into a gap space between the IC chip and the mounting substrate.

According to example embodiments of the present general inventive concept, the bump structure may make contact with the electrode pad in cell and peripheral areas of the IC chip in such a configuration that the bump structure may be shifted from the underlying wiring line by a gap distance. Therefore, although the internal stresses of the IC chip may be varied according to external impacts caused by the installation of external electronic appliances, bonding of the IC chip and the mounting substrate and the formation of the bump structure, the internal stresses may be sufficiently prevented from being concentrated to the wiring line, to thereby minimize the crack and the peeling on the wiring line in the IC chip. In addition, the electrode pad and the bump structure may make contact with a number of contact points, to thereby improve contact reliability of the bump structure. Accordingly, the product reliability of the IC chip and the flip chip package including the IC chip may be significantly improved by the shift of the bump structure from the wiring line in the pseudo pad area.

Exemplary embodiments of the present general inventive concept also provide an integrated circuit (IC) chip, including an IC device including at least a substrate, an insulation, layer, and a wiring line, the IC device having a first area and a second area, a first electrode pad disposed on the insulation layer of the IC device in the first area that does not make contact with the wiring line, a first bump structure disposed on the first area to make contact with the first electrode pad, a second electrode pad disposed on the insulation layer of the IC device in the second area that makes contact with the wiring line, and a second bump structure disposed on the second area to make contact with the second electrode pad at a contact point that is spaced apart from the wiring line.

Exemplary embodiments of the present general inventive concept also provide an integrated circuit (IC) chip, including an IC device including at least a substrate, an insulation, layer, and a wiring line, the IC device having a first area and a second area, a first electrode pad disposed on the insulation layer of the IC device in the first area that does not make contact with the wiring line, a first bump structure disposed on the first area to make contact with the first electrode pad, a second electrode pad disposed on the insulation layer of the IC device in the second area that makes contact with the wiring line, and a second bump structure to make contact with the second electrode pad at a first contact point that is spaced apart from the wiring line at a first distance in a first direction, and to make contact with the second electrode pad at a second contact point that is spaced apart from the wiring line at a second distance in a second direction.

Exemplary embodiments of the present general inventive concept also provide a method of manufacturing an integrated circuit (IC) chip, the method including forming an IC device including at least a substrate, an insulation, layer, and a wiring line, the IC device having a first area and a second area, forming a first electrode pad on the insulation layer of the IC device in the first area that does not make contact with the wiring line, forming a first bump structure on the first area to make contact with the first electrode pad, forming a second electrode pad on the insulation layer of the IC device in the second area that makes contact with the wiring line, and forming a second bump structure on the second area to make contact with the second electrode pad at a contact point that is spaced apart from the wiring line.

Exemplary embodiments of the present general inventive concept also provide a method of manufacturing an integrated circuit (IC) chip, the method including forming an IC device including at least a substrate, an insulation, layer, and a wiring line, the IC device having a first area and a second area, forming a first electrode pad on the insulation layer of the IC device in the first area that does not make contact with the wiring line, forming a first bump structure on the first area to make contact with the first electrode pad, forming a second electrode pad on the insulation layer of the IC device in the second area that makes contact with the wiring line, and forming a second bump structure on the second area to make contact with the second electrode pad at a first contact point that is spaced apart from the wiring line at a first distance in a first direction, and to make contact with the second electrode pad at a second contact point that is spaced apart from the wiring line at a second distance in a second direction.

BRIEF DESCRIPTION OF THE DRAWINGS

The above and/or other aspects of the present general inventive concept will become apparent and more readily appreciated from the following description of the exemplary embodiments, taken in conjunction with the accompanying drawings, in which:

FIG. 2A is a cross-sectional view illustrating a contact structure between the first electrode pad and the first bump structure in the first area of the IC chip illustrated in FIG. 1 according to exemplary embodiments of the present general inventive concept;

FIG. 2B is a cross-sectional view illustrating a first contact structure between the second electrode pad and the second bump structure in the second area of the IC chip illustrated in FIG. 1 according to exemplary embodiments of the present general inventive concept;

DETAILED DESCRIPTION OF THE EMBODIMENTS

Figure 1:
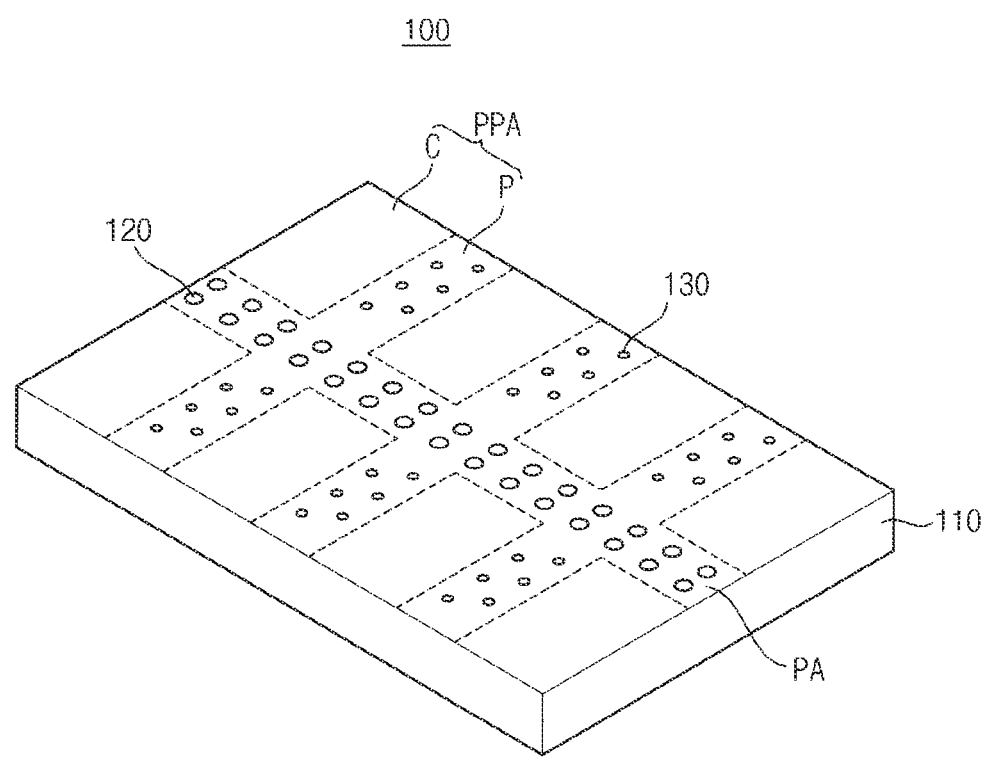
FIG. 1 is a plan view illustrating an integrated circuit (IC) chip in accordance with example embodiments of the present general inventive concept.

Various example embodiments will be described more fully hereinafter with reference to the accompanying drawings, in which example embodiments of the present general inventive concept are illustrated. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present general inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present general inventive concept are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments of the present general inventive concept should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present general inventive concept.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

FIG. 1 is a plan view illustrating an integrated circuit (IC) chip in accordance with example embodiments of the present general inventive concept.

Referring to FIG. 1, an integrated circuit (IC) chip 100 in accordance with example embodiments of the present general inventive concept may include an IC device 110 and first and second bump structures 120 and 130. The IC device 110 may include a plurality of conductive structures (not illustrated) that may be stacked on a semiconductor substrate such as a wafer, and a plurality of wiring structures to electrically interconnect the conductive structures. The first and second bump structures 120 and 130 may communicate data signals with the conductive structures of the IC device 110.

In example embodiments of the present general inventive concept, the conductive structures may be stacked on the wafer to manufacture a semiconductor device, and the wiring structures may be arranged over the conductive structures. The wiring structures may be electrically insulated from the conductive structures by an insulation layer.

For example, the conductive structure may include an operation unit for a volatile memory device such as a dynamic random access memory (DRAM) device having at least one transistor and one capacitor, and an operation block unit of a non-volatile memory device such as a flash memory device having a string selection transistor, cell transistors, and a ground selection transistor.

For example, the wiring structure may include a metal plug to penetrate through the insulation layer and to make contact with the conductive structure, and a wiring line to contact with the metal plug and arranged on the insulation layer. The wiring line may include a signal line to transfer input and output signals, a power line to apply an electrical power to the conductive structures of the IC structure 110, and a ground line to electrically ground the conductive structures.

A plurality of first and second bump structures 120 and 130 may be arranged on the IC device 110, and external signals received by the IC device 110 may be transferred to the wiring lines through the first and second bump structures 120 and 130. The IC device 110 may be mechanically combined with a mounting substrate, which will be described hereinafter, by the bump structures 120 and 130. The external signals may be transferred to the IC device 110 through the bump structures 120 and 130.

In an example embodiments of the present general inventive concept, the first bump structure 120 may be regularly arranged (e.g., the bumps of the first bump structure 120 may arranged at predetermined intervals from one another) in a first area of the IC device 110, for example a pad area PA, and the second bump structure 130 may be randomly arranged (e.g., the bumps of the second bump structure 120 may be arranged at random intervals from one another) in a second area of the IC device 110. The second area may correspond to residuals of the IC device 110 except the first area and may include cell area (e.g., area 'C' as illustrated in FIG. 1) and peripheral area (e.g., area 'P' as illustrated in FIG. 1) of the IC device 110. Hereinafter, the second area may be referred to as pseudo pad area (PPA) as compared with the pad area PA. The PPA can include the cell area 'C' and the peripheral area 'P,' as illustrated in FIG. 1.

The first area or the pad area PA may include a spare area or a subsidiary area of the IC device 110 and one or more terminals for operating the conductive structures in the cell area (e.g., cell area 'C'), and the peripheral area (e.g., peripheral area 'P') may be provided in the first area PA. The cell area and the peripheral area may be a main area in view of the spare area or the subsidiary area of the IC device 110. The conductive structures of the IC device 110 may be arranged in the cell area and driving circuits for driving the conductive structures may be arranged in the peripheral area.

In example embodiments of the present general inventive concept, a plurality of connection terminals to transfer external signals to the conductive structures may be arranged in the first area PA, and the external signals may be applied to the conductive structures via the connection terminals. The wiring lines in the cell and peripheral areas of the IC device 110 may extend to a first electrode pad of the first area PA. Particularly, the bump structures 120 and a plurality of the first electrode pads electrically connected to the bump structures 120 may be arranged in a line in the first area PA and the wiring lines of the IC device 110 may extend to the first electrode of the first area PA from the second areas PPA including the cell and peripheral areas. Thus, no wiring lines to transfer the signals to the conductive structures may be arranged in the first area PA, and thus the method of forming the first bump structure 120 may not cause damage and/or may minimize damage to the wiring lines. A plurality of the connection terminals and a plurality of the electrode pad electrically connected with the connection terminals may be arranged in at least a portion of the first area or the pad area PA and no wiring lines may be arranged in the first area PA.

Although the example embodiments of the present general inventive concept described above discusses that the first area PA that may be arranged in a central area of the IC device 110 (center type), any other modifications may be made to the shape and structure of the pad area to carry out the exemplary embodiments of the present general inventive concept as disclosed herein. For example, the pad area PA may be arranged at both edge portions of the IC device 110 (edge type), and thus the cell and peripheral areas may be interposed between both lateral pad areas.

The IC device 110 may be operated by one or more signals that may be applied through the first bump structure 120. The signals may be transferred to the IC device 110 via the first electrode pad in the first area PA. One or more first electrode pads may be arranged in the first area PA in accordance with the signals applied to the first bump structure 120. For example, the first electrode pad may include a data signal pad to communicate one or more data signals with the conductive structures, a power pad to apply an electrical power to the conductive structures, and a ground pad to electrically ground the conductive structures.

The conductive structures may be arranged in the second area PPA, including in the cell and peripheral areas, through one or more manufacturing processes of a semiconductor device. The wiring lines may be arranged at a top portion of the second area PPA.

In exemplary embodiments of the present general inventive concept, the second bump structures 130 and the second electrode pad electrically connected with the second bump structure 130 and the wiring lines may be electrically connected to the second electrode pad. Particularly, main signals to operate the conductive structures may be applied to the IC device 110 through the first bump structure 120, and supplemental signals to selectively operate the conductive structures may be applied to the IC device 110 through the second bump structure 130. Thus, the second electrode pad may be optionally arranged in the second area and may make direct contact with the wiring lines. The connection terminals and the second electrode pads electrically connected to the connection terminals may be optionally and selectively arranged in the second area to carry out the exemplary embodiments of the present general inventive concept, and thus the second area may be referred to as the pseudo pad area PPA.

The second bump structure 130 may be randomly arranged in the second area in accordance with characteristics of the respective conductive structure and the characteristics of the IC chip 100 so as to carry out the exemplary embodiments of the present general inventive concept disclosed herein. The second electrode pad may include a subsidiary power pad to apply a subsidiary power to the respective conductive structure, and a subsidiary ground pad to increase and/or improve the electrical ground characteristics of the IC device 110.

For example, when the first bump structure 120 may transfer an insufficient driving power (e.g., a driving power that is less than a predetermined threshold operating power) to the conductive structure in view of a high operation speed (e.g., an operation speed that is greater than or equal to a predetermined threshold operation speed) of the IC device 110, a subsidiary power may be transferred to the conductive structure of the IC device 110 through the second bump structure 130. When the conductive structure may not be sufficiently grounded to surroundings by the first bump structure 120, the electrical ground characteristics of the conductive structure may be improved and/or increased by using the second electrode pad.

While no wiring lines may be arranged in the first area PA, one or more wiring lines may be arranged in the second area PPA. Thus, in contrast to the first bump structure 120, the second structure 130 may be spaced apart from the wiring lines underlying the second structure 130. The wiring lines in the second area may be protected when the second bump structure 130 is formed, and thus damage to the wiring lines may be minimized when forming the bump structure 130.

FIG. 2A is a cross-sectional view illustrating a contact structure between the first electrode pad and the first bump structure in the first area of the IC chip illustrated in FIG. 1 according to exemplary embodiments of the present general inventive concept.

Referring to FIG. 2A, the first electrode pad 114a may be positioned on an insulation layer 112 in the first area PA of the IC device 110 and the conductive structures, and the wiring lines stacked on a substrate 111 may be electrically insulated from the first electrode 114a by the insulation layer 112. A passivation pattern 113 and a buffer pattern 115 may be sequentially formed on the first electrode 114a and the insulation layer 112, and a top surface of the first electrode pad 114a may be partially exposed through an opening.

The first electrode pad 114a may be electrically connected to the wiring lines of the IC device 110, and the passivation pattern 113 may comprise silicon oxide. The passivation pattern 113 may cover the conductive structures and the wiring lines, and thus protect the conductive structures and the wiring lines in a subsequent process. The passivation pattern 113 may include a first passivation opening 113a through which the first electrode 114a may be partially exposed. The first electrode 114a may comprise a conductive metal such as copper (Cu) and aluminum (Al). The first electrode pad 114a may further include an absorber (not illustrated) to absorb mechanical loads in an adhesion step of a package bonding process or in a contact step with a probe tip in an electrical die sorting (EDS) process.

The buffer pattern 115 may include an insulation material, a polyimide film, and an epoxy resin. The buffer pattern 115 may absorb the load of the first bump structure 120 and thus the conductive structure underlying the insulation layer 112 may be prevented from being pressed by the first bump structure 120, or may minimize the pressing by the first bump structure 120.

The buffer pattern 115 may include a first buffer opening 115a having a size smaller than or equal to that of the passivation opening 113a. The first electrode pad 114a may be partially exposed through the passivation opening 113a and the buffer opening 115a. In example embodiments of the present general inventive concept, the passivation opening 113a and the first buffer opening 115a may be shaped concentric rings.

The first bump structure 120 may be positioned on the buffer pattern 115a and may make contact with a portion of the first electrode 114a exposed through the passivation opening 113a and the buffer opening 115a. For example, the first bump structure 120 may include an under-barrier metal (UBM) layer 122 to make contact with the first electrode pad 114a and a spherical solder bump 121 on the UBM layer 122. A high conductive metal pillar (not illustrated) may be interposed between the UBM layer 122 and the solder bump 121.

The solder bump 121 may include an alloy of lead (Pb) and tin (Sn) and the UBM layer 122 may improve bonding characteristics between the solder bump 121 and the first electrode pad 114a. In addition, the UBM layer 122 may prevent the diffusion of the solder bump 121 into the first electrode pad 114a in a reflow process to form the solder bump 121.

For example, the UBM layer 122 may include a barrier layer (not illustrated) to minimize and/or prevent the diffusion of the solder bump 121 into the first electrode pad 114a and a metal layer (not illustrated) to increase and/or improve a bonding force between the barrier layer and the solder bump 121. Otherwise, the UBM layer 122 may include a nickel layer coated on the first electrode pad 114a by an electroless plating process.

Since no wiring lines of the IC device 110 may be arranged under the first electrode pad 114a, damage to the wiring lines in the forming of the first bump structure 120 may be minimized. For example, no stress or stress below a predetermined threshold may be applied to the wiring line in the forming of the first bump structure 120 and thus the cracks and the surface peeling caused by the stress concentration on the wiring lines may be minimized and/or prevented when forming the first bump structure 120. In the example embodiments of the present general inventive concept, a central axis of the first bump structure 120 may coincide with that of the first electrode pad 114a.

In contrast, the central axis of the second bump structure 130 may be spaced apart from that of the second electrode pad 114b in such a configuration that the central axis of the second bump structure 130 may be spaced apart from the wiring lines of the IC device 110 as illustrated in FIG. 2B. Damage to the wiring lines may be minimized and/or prevented from being damaged in the forming of the second bump structure 130.

FIG. 2B is a cross-sectional view illustrating a first contact structure between the second electrode pad and the second bump structure in the second area of the IC chip illustrated in FIG. 1. FIGS. 2A and 2B illustrate the same IC chip 100 at the first and second areas, respectively. Therefore, in FIG. 2B, the same reference numerals denote the same elements in FIG. 2A and the detailed descriptions of the same elements will be omitted.

Referring to FIG. 2B, the wiring lines 116 may be positioned under the second electrode pad 114*b* that may be positioned in the second area PPA of the IC device 110.

In example embodiments of the present general inventive concept, the wiring line 116 may include a metal wiring electrically connected to the conductive structures and may be electrically insulated from the conductive structures by the insulation layer 112.

The second electrode pad 114*b* may be partially exposed through a second passivation pattern 113*b*, and a second buffer opening 115*b* and the second bump structure 130 may make direct contact with the exposed portion of the second electrode pad 114*b*.

A second bump structure 130 can include a spherical solder bump 131 and a second under barrier metal (UBM) layer 132.

The central axis of the second bump structure 130 may be spaced apart or shifted from the center of the wiring line by a first distance d1, thereby minimizing the damage to the wiring line that may be caused by forming the second bump structure 130. For example, an internal stress caused by the load of the second bump structure 130 may be prevented and/or minimized from being concentrated into the wiring line 116, to thereby minimize the cracks and the surface peeling caused by the stress concentration on the wiring lines 116 in forming the second bump structure 130.

The first distance d1 may be determined (e.g., by a computer simulation and/or measurement with a measuring unit) to minimize the damage to the wiring line 116 in consideration of neighboring conductive structures around the second bump structure 130. Particularly, a bundle of the wiring structures such as metal wirings and interconnection plugs may be arranged under the second bump structure 130, the bundle of the wiring structures may be treated as a single wiring structure as a whole, and the first distance d1 may be determined as a gap distance between the central axis of the second bump structure 130 and a center of the bundle of the wiring structures.

While the example embodiments of the present general inventive concept described above discuss the shift of the second bump structure with respect to the wiring structure, the second bump structure 130 may be shifted from any other underlying structures known to one of the ordinary skill in the art so as to minimize the damage to the underlying structures in the forming the second bump structure 130. Although the example embodiments of the present general inventive concept described above disclose that the second bump structure 130 may be shifted leftwards from the underlying wiring structure, the second bump structure 130 may be shifted in any other direction from the underlying wiring structure in view of the characteristics of the IC chip 100 and the package including the IC chip 100, as would be known to one of the ordinary skill in the art.

Figure 2C:
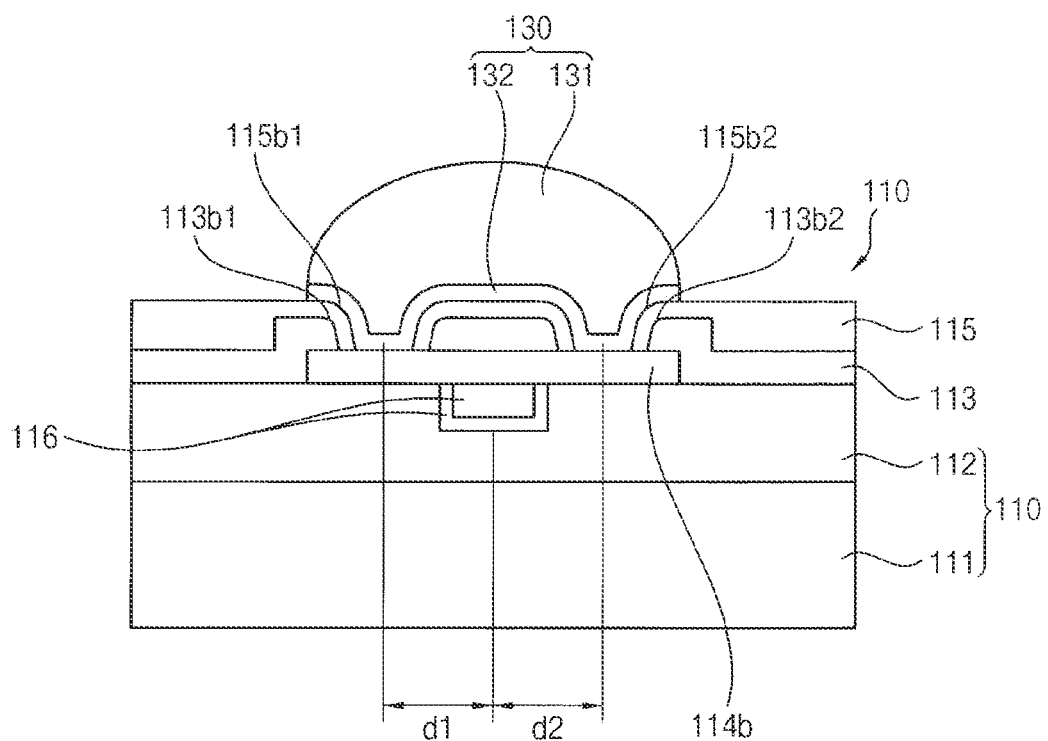
FIG. 2C is a cross-sectional view illustrating a second contact structure between the second electrode pad and the second bump structure in the second area of the IC chip illustrated in FIG. 1 according to exemplary embodiments of the present general inventive concept.

Particularly, when the second bump structure 130 make contact with the second electrode pad 114*b* at two or more points, a plurality of the second passivation openings 113*b* and the second buffer openings 115*b* may be provided in the IC device 110, as illustrated in FIG. 2C.

FIG. 2C is a cross-sectional view illustrating a second contact structure between the second electrode pad 114*b* and the second bump structure 130 in the second area of the IC chip 100 illustrated in FIG. 1. That is, the second bump structure may contact second electrode pad 114*b* at a plurality of points that are at least partially exposed by a pair of split openings 113*b*1 and 113*b*2, and a corresponding pair of first and second split buffer openings 115*b*1 and 115*b*2.

Referring to FIG. 2C, the wiring line 116 may be arranged under a central portion of the second electrode pad 114*b* and the second passivation opening 113*b* may include the pair of split openings 113*b*1 and 113*b*2 that may be positioned opposite to each other. A first split passivation opening 113*b*1 may be spaced apart or shifted in a first direction from the center of the wiring line 116 by the first distance d1, and a second split passivation opening 113*b*2 may be spaced apart or shifted in a second direction from the center of the wiring line 116 by a second distance d2. The second buffer opening 115*b* may also include the pair of first and second split buffer openings 115*b*1 and 115*b*2 that may correspond to the first split passivation opening 113*b*1 and the second split passivation opening 113*b*2, respectively. Therefore, the second bump structure 130 may make contact with the second electrode pad 114*b* at two points which may be exposed through the split openings 113*b*1 and 115*b*1 and 113*b*2 and 115*b*2.

In example embodiments of the present general inventive concept, the first split openings 113*b*1 and 115*b*1 and the second split openings 113*b*2 and 115*b*2 may be symmetrical to each other with respect to the wiring line 116, and thus the first distance d1 may be substantially identical to the second distance d2.

The second bump structure 130 may be supported by the second electrode pad 114*b* at multiple contact points and thus the internal stress due to the second bump structure 130 may be minimized and/or prevented from being concentrated at one point. That is, the stress concentration may be sufficiently prevented and/or minimized by the multi-point contact between the second bump structure 130 and the second electrode pad 114*b*. The multi-point contact may improve and/or increase contact reliability between the second bump structure 130 and the second electrode pad 114*b*. Although the contact of the second bump structure 130 and the second electrode pad 114*b* through the first split openings 113*b*1 and 115*b*1 may be broken at the left side of the wiring line 116, the contact of the second bump structure 130 and the second electrode pad 114*b* through the second split openings 113*b*2 and 115*b*2 may remain unchanged at the right side of the wiring line 116, to thereby increase the contact reliability of the second bump structure 130.

Although the example embodiments of the present general inventive concept discussed above disclose that the first split openings 113*b*1 and 115*b*1 may be positioned symmetrical to the second split openings 113*b*2 and 115*b*2 with respect to the wiring line 116, any other modified configurations known to one of the ordinary skill in the art may be made in the IC device 110. For example, the first and second split openings 113*b*1, 115*b*1, 113*b*2 and 115*b*2 may be arranged at the same side portion of the metal wiring 116 in a line.

That is, when the metal wiring 116 may be arranged under the central portion of the second electrode pad 114*b*, the central axes of the first and second split openings 113*b*1, 115*b*1, 113*b*2 and 115*b*2 may be spaced apart from the center of the wiring line 116 by first and second distances d1 and d2, respectively, in the same direction. Therefore, the second bump structure 130 may make contact with a first portion of the second electrode pad 114*b* at two points.

The number of contact points and the contact configuration between the second bump structure 130 and the second electrode pad 114b may be varied in accordance with process conditions and device features of the IC device 110 to carry out the exemplary embodiments of the present general inventive concept as disclosed herein.

According to example embodiments of the present general inventive concept, the bump structure of the IC chip 100 may make contact with the electrode pad in the pseudo pad area (PPA) of the IC chip in such a configuration that the bump structure may be shifted from the underlying wiring line by a gap distance. Therefore, stress concentration to the wiring line may be minimized and/or prevented, to thereby minimize the crack and the peeling on the wiring line in the IC chip. The electrode pad and the bump structure may make contact with a plurality of contact points, to thereby improve and/or increase contact reliability of the bump structure.

Hereinafter, a method of manufacturing the IC chip 100 illustrated in FIG. 1 will be described in detail with reference to FIGS. 3A to 3H.

FIGS. 3A to 3H are cross-sectional views illustrating a method of manufacturing the IC chip illustrated in FIG. 1. In FIGS. 3A to 3H, the same reference numerals denote the same elements in FIGS. 1 and 2A to 2C.

Figure 3A:
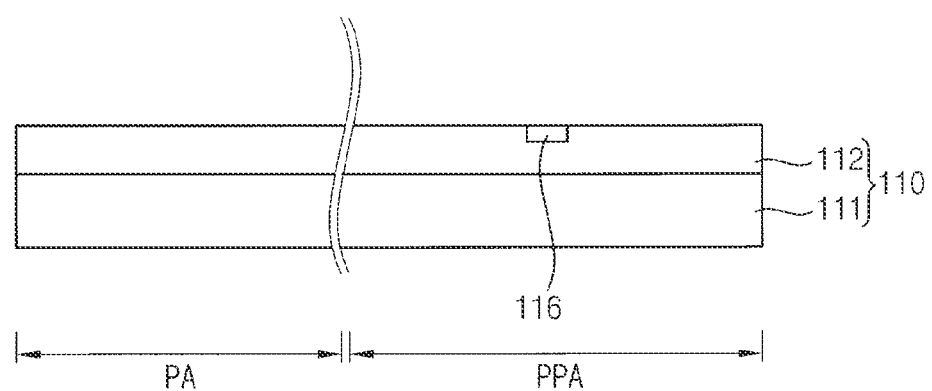
FIGS. 3A to 3H are cross-sectional views illustrating a method of manufacturing the IC chip illustrated in FIG. 1 according to exemplary embodiments of the present general inventive concept.

Referring to FIG. 3A, a plurality of the conductive structures (not illustrated) and the wiring structure including the wiring line 116 to drive the conductive structures may be formed on the substrate 111 such that the conductive structure and the wiring structure may be electrically insulated from each other by the insulation layer 112, to thereby form the integrated circuit (IC) device 110. The IC device 110 may include the first area or the pad area PA in which the wiring line 116 may not be arranged and an additional conductive line (not illustrated) extending to the wiring line 116 may be prepared, and the second area or the pseudo pad area PPA in which the wiring line 116 may be arranged. That is, the IC device 110 may include a first area without the wiring line 116, a second area including the wiring line 116, and an additional conductive line to extend to the wiring line 116.

In example embodiments of the present general inventive concept, the substrate 111 may include a semiconductor substrate such as a wafer, and the conductive structures may be stacked on the wafer through a series of unit processes to manufacture a semiconductor device. The wiring line 116 may include a plurality of metal lines through which data signals and a power signal may be transferred to the conductive structures, and may be arranged in the second area PPA. In contrast, the connection terminals to transfer input signals to the wiring line 116 may be arranged in the first area PA. Therefore, no wiring lines 116 may be arranged in the first area PA and the connection terminals to transfer the signals to the wiring line, and the absorbers to absorb external shocks (e.g., absorb shocks from a subsequent process such as an electrical die sorting (EDS) process) may be arranged in the first area PA.

In example embodiments of the present general inventive concept, the insulation layer 112 may comprise an oxide and a nitride, and the wiring line 116 may be electrically insulated from the conductive structures by the insulation layer 112. The wiring structure may include an interconnection plug (not illustrated) penetrating through the insulation layer 112 and making contact with the conductive structure, and a metal line making electrical contact with the interconnection plug.

Figure 3B:
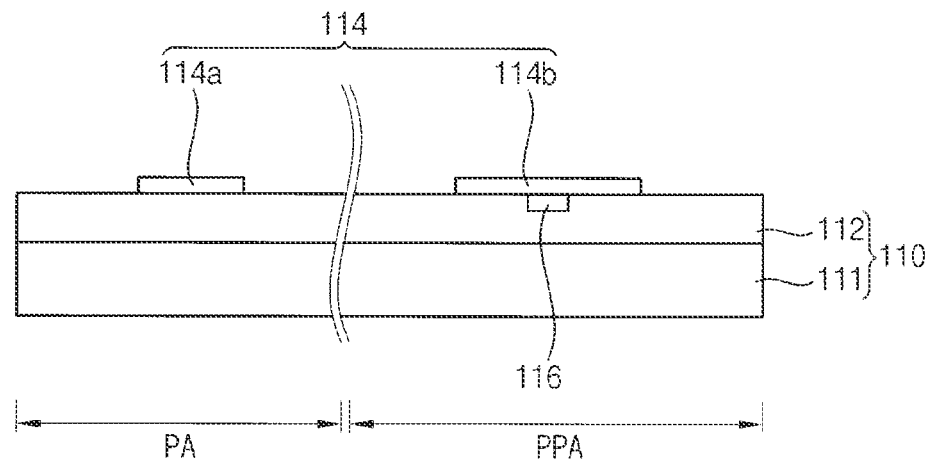

Referring to FIG. 3B, an electrode pad 114 may be formed in the first and second areas PA and PPA of the IC device 110, respectively. For example, the first electrode pad 114a may be arranged in the first area PA and may be electrically connected to the wiring line 116 of the IC device 110, and the second electrode pad 114b may be arranged in the second area PPA and may make contact with the wiring line 116 of the IC device 110.

The first electrode pad 114a may be regularly arranged in the first area PA. That is, the first electrode pads 114a may arranged at predetermined intervals from one another in the first area PA. In contrast, the second electrode pad 114b may be randomly arranged in the second area PPA in such a manner that a specific wiring line may be at least partially covered with the second electrode pad 114b in accordance with the characteristics of the IC device 110. That is, the second electrode pads 114b may be arranged at random intervals from one another. The electrode pad 114 may include a conductive material such as copper (Cu) and aluminum (Al).

The first electrode pad 114a may be formed into a predetermined pattern shape in the first area PA that may be ready for the electrode pad in advance. In contrast, the second electrode pad 114b may be optionally or selectively formed in the second area PPA in such a manner that a specific wiring line may be covered with the second electrode pad 114b such that a specific data signal or a power signal may be supplementary added or an electrical ground line may be added to a specific conductive structure corresponding to the specific wiring line.

In example embodiments of the present general inventive concept, the first area PA may be positioned at the central portion of the IC device 110 and the second area PPA, including the cell and peripheral areas (e.g., areas 'C' and 'P,' respectively, as illustrated in FIG. 1), may be positioned at both side portions of the first area PA. The conductive structures may be formed in the cell area, and a logical circuit to drive the conductive structure may be formed on the peripheral area. Otherwise, the first area PA may be arranged at both edge portions of the IC device 110 and the second area PPA may be interposed between the lateral first areas PA, as would be known to one of the ordinary skill in the art.

Figure 3C:
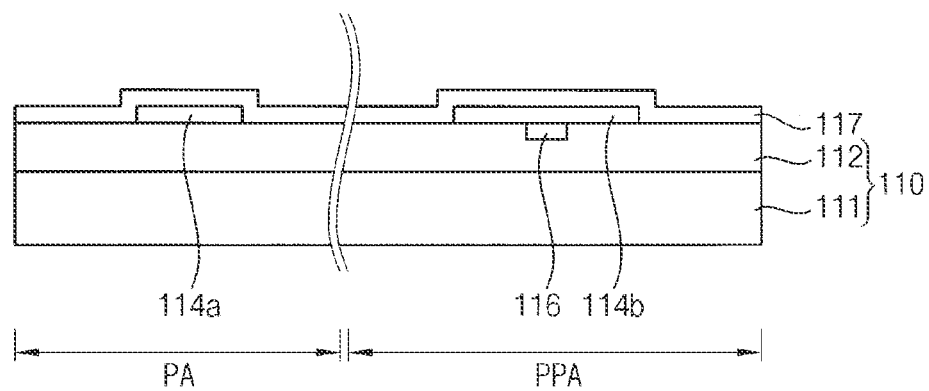

Referring to FIG. 3C, a passivation layer 117 may be formed on the IC device 110 including the electrode pad 114.

In example embodiments of the present general inventive concept, the passivation layer 117 may comprise silicon oxide, silicon nitride and a composite thereof. The passivation layer 117 may protect the conductive structures from the environment.

Figure 3D:
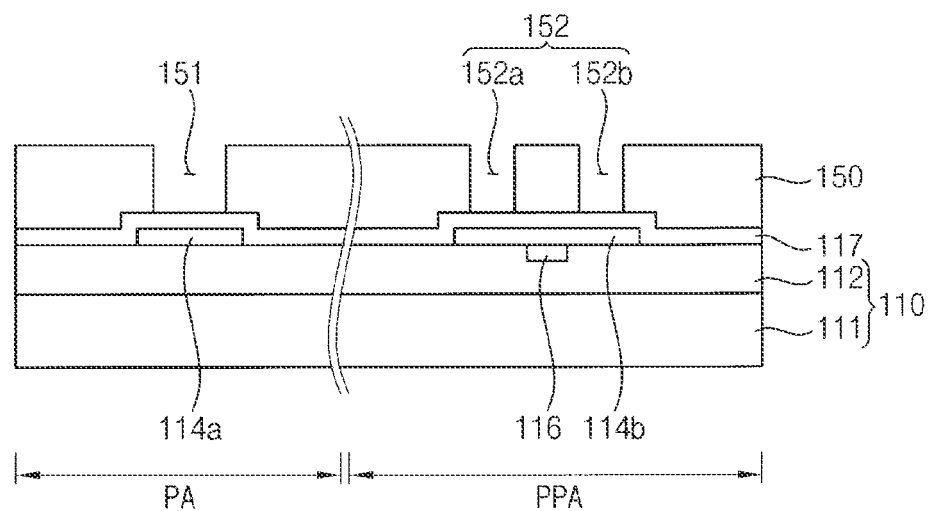

Referring to FIG. 3D, a first mask pattern 150 may be formed on the passivation layer 117 such that the first mask pattern 150 may include a first mask opening 151 through which the passivation layer 117 corresponding to the first electrode pad 114a may be partially exposed in the first area PA, and a second mask opening 152 through which the passivation layer 117 corresponding to the second electrode pad 114b may be partially exposed in the second area PPA.

In example embodiments of the present general inventive concept, the first mask pattern 150 may include a photoresist pattern. Particularly, the second mask opening 152 may include a first split mask opening 152a of which the central axis may be spaced apart from the center of the second electrode pad 114b in the first direction, and a second split mask opening 152b of which the central axis may be spaced apart from the center of the second electrode pad 114b in the second direction that can be different from the first direction.

For example, the gap distance between the central line of each of the split mask openings 152a and 152b may be determined by a shift value in the mask pattern process. The shift value of the mask pattern may indicate an amount of distance shifted from the center of the wiring line 116. That is, the shift value is the distance between the center of the wiring line 116 and a central line of at least one of the split mask openings 152a and 152b. Thus, the passivation layer 117 may be partially exposed through the first and second split mask openings 152a and 152b in the second area PPA, and the passivation layer 117 corresponding to both lateral portions of the second electrode pad 114b may be exposed through the second mask opening 152.

Figure 3E:
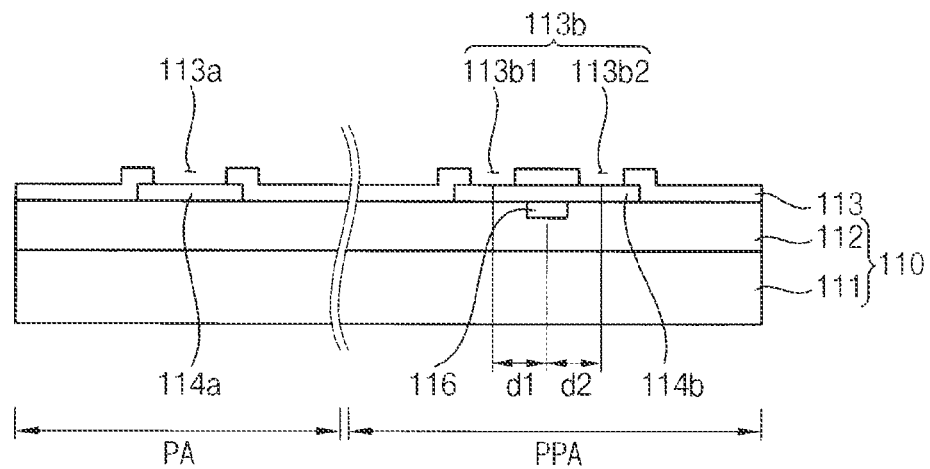

Referring to FIG. 3E, the passivation layer 117 may be etched off from the insulation layer 112 by an etching process using the first mask pattern 150 as an etching mask, to thereby form the passivation pattern 113 including the first passivation opening 113a and the second passivation opening 113b. The first electrode pad 114a may be partially exposed through the first passivation opening 113a and the second electrode pad 114a may be partially exposed through the second passivation opening 113b.

In example embodiments of the present general inventive concept, a central portion of the first electrode 114a may be exposed through the first passivation opening 113a. In contrast, opposite side portions of the second electrode pad 114b, which may be spaced from a central line thereof, may be exposed through the second passivation opening 113b. In such a case, the central line of the electrode pad may pass through the substrate via a center point of the surface of the electrode pad.

For example, the second passivation opening 113b may include a first split passivation opening 113b1 through which a first side portion of the second electrode pad 114b may be exposed, and a second split passivation opening 113b2 through which a second side portion of the second electrode pad 114b may be exposed. That is, the central axis of the first split passivation opening 113b1 may be spaced apart from the central line of the second electrode pad by a first distance d1 in the first direction, and the central axis of the second split passivation opening 113b2 may be spaced apart from the central line of the second electrode pad by a second distance d2 in the second direction different from the first direction. Thus, the first side portion that may be off from the central line of the second electrode pad 114b in the first direction may be exposed through the first split passivation opening 113b1, and the second side portion that may be off from the central line of the second electrode pad 114b in the second direction may be exposed through the second split passivation opening 113b2.

In example embodiments of the present general inventive concept, the first and second directions may be symmetrical to each other with respect to the central line of the second electrode pad 114b and left and right side portions of the second electrode pad 114b may be exposed through the second passivation opening 113b.

In example embodiments of the present general inventive concept, the split passivation openings 113b1 and 113b2 may be formed at a single side portion of the second electrode pad 114b, and thus one of the opposite side portions of the second electrode pad 114b may be exposed through the split passivation openings 113b1 and 113b2. That is, the central axes of the first and second split passivation openings 113b1 and 113b2 may be spaced apart from the central line of the second electrode pad 114b in the same directions. In example embodiments of the present general inventive concept, the first and second distances d1 and d2 may be formed to be identical, and thus the first and second split passivation openings 113b1 and 113b2 may be arranged in a line at one of the side portions of the second electrode pad 114b. Since the wiring line 116 may be arranged under the central portion of the second electrode pad 114b, the first and second side portions of the second electrode pad 114b may be spaced apart from the wiring line 116 by the first and second distances d1 and d2.

Figure 3F:
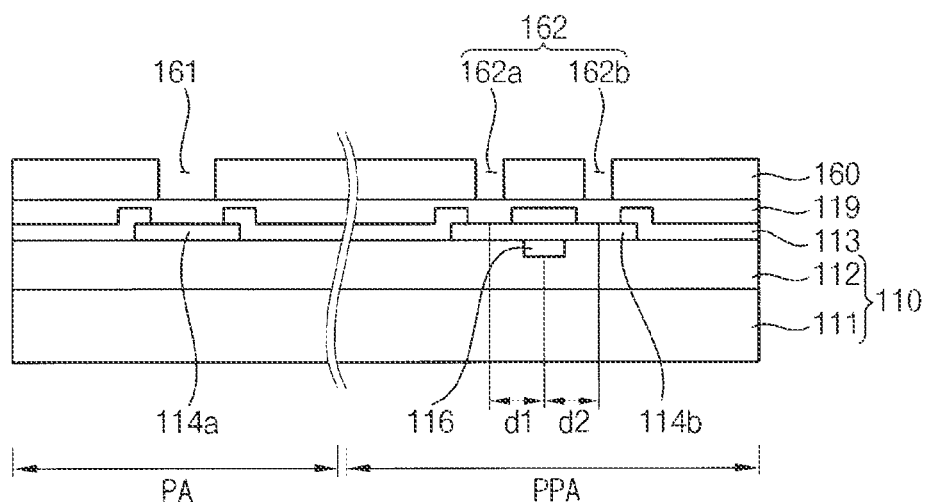

Referring to FIG. 3F, a buffer layer 119 may be formed on the passivation pattern 113 and a second mask pattern 160 may be formed on the buffer layer 119 such that the buffer layer 119 may be at least partially exposed through the second mask pattern 160 so as to correspond to the first and second passivation openings 113a and 113b.

For example, the buffer layer 119 may be formed on the passivation pattern 113 to a sufficient thickness to fill up the first and second passivation openings 113a and 113b by a deposition process. An upper portion of the buffer layer 119 may be planarized by a planarization process such as a chemical mechanical polishing (CMP) process. For example, the buffer layer 119 may include a nitride layer, a polyimide film, and an epoxy resin layer. The first and second electrode pads 114a and 114b may be electrically insulated from each other by the buffer layer 119 and may absorb the load of the bump structure that may be formed on the buffer layer 119 in a subsequent process. The buffer layer 119 may mitigate and/o minimize the mechanical stress in a subsequent reflow process to form the bump structure.

The second mask pattern 160 may be formed on the planarized buffer layer 119 and include a third mask opening 161 through which the buffer layer 119 corresponding to the first electrode pad 114a may be exposed in the first area PA and a fourth mask opening 162 through which the buffer layer 119 corresponding to the second electrode pad 114b may be exposed in the second area PPA. The third mask opening 161 may have a size smaller than or equal to that of the first mask opening 151, and the fourth mask opening 162 may have a size smaller than or equal to that of the second mask opening 152.

Particularly, the fourth mask opening 162 may include a third split mask opening 162a of which the central axis may be spaced apart from the center of the second electrode pad 114b in the first direction, and a fourth split mask opening 162b of which the central axis may be spaced apart from the center of the second electrode pad 114b in the second direction different from the first direction. Thus, the buffer layer 119 may be partially exposed through the third and fourth split mask openings 162a and 162b in the second area PPA, and the buffer layer 119 corresponding to both lateral portions of the second electrode pad 114b may be exposed through the fourth mask opening 162.

Figure 3G:
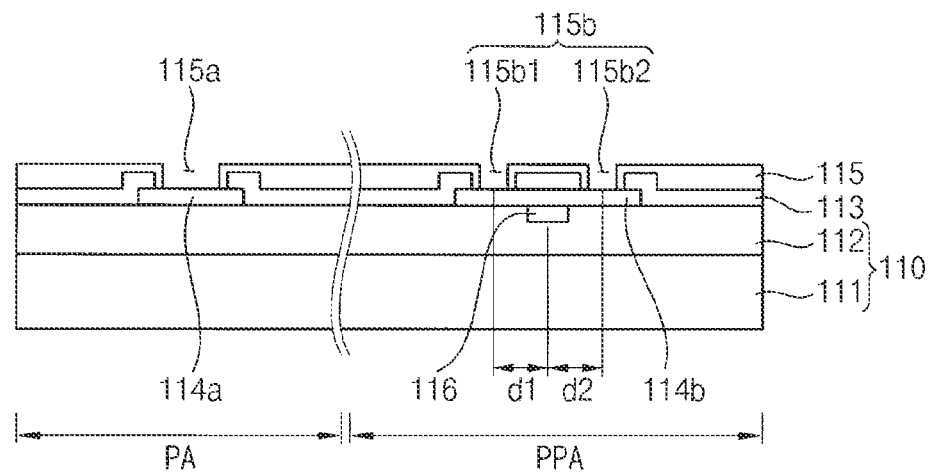

Referring to FIG. 3G, the buffer layer 119 may be etched off from the passivation pattern 113 by an etching process using the second mask pattern 160 as an etching mask, to thereby form the buffer pattern 115. In example embodiments of the present general inventive concept, the buffer pattern 115 may include a first buffer opening 115a through which the first electrode pad 114a may be partially exposed in the first area PA and a second buffer opening 115b through which the second electrode pad 14b may be partially exposed in the second area PPA.

Particularly, the second buffer opening 115b may include a first split buffer opening 115b1 through which the first side portion of the second electrode pad 114b may be exposed and a second split buffer opening 115b2 through which the second side portion of the second electrode pad 114b may be exposed and the split buffer openings 115b1 and 115b2 and the split passivation openings 113b1 and 113b2 may be concentric rings. That is, the central axis of the first split buffer opening 115b1 may be spaced apart from the central line of the second electrode pad 114b by the first distance d1 in the first direction and the central axis of the second split buffer opening 115b2 may be spaced apart from the central line of the second electrode pad 114b by the second distance d2 in the second direction that can be different from the first direction. Thus, the first side portion that may be spaced from the central line of the second electrode pad 114b in the first direction, may be exposed through the first split passivation opening 113b1 and the first split buffer opening 115b1, and the second side portion that may be spaced from the central line of the second electrode pad 114b in the second direction may be exposed through the second split passivation opening 113b2 and the second split buffer opening 115b2. Therefore, the mechanical stress applied to the wiring line 116 in the etching process to form the split openings may be sufficiently prevented and/or minimized from being concentrated to one point of the wiring line 116. The second bump structure 130 may contact the second electrode pad 114b at many contact points, to thereby minimize the stress concentration to the wiring line 116 caused by the load of the second bump structure.

Since the stress concentration to the wiring line 116 may be mitigated as the first and second distances d1 and d2 may increase, the first and second distances d1 and d2 may be determined so as to decrease the summation of the stresses in view of the stress concentrations to one or more of the wiring lines (e.g., all of the wiring lines) and the conductive structures in the second area PPA.

In example embodiments of the present general inventive concept, the passivation mask openings 151 and 152 and the buffer mask openings 161 and 162 may be formed through a respective photolithography process. The passivation mask openings 151 and 152 and the buffer mask openings 161 and 162 may be simultaneously formed through a single photolithography process, as would be known to one of the ordinary skill in the art.

Particularly, the passivation layer 117 and the buffer layer 119 may be consecutively formed on the insulation layer 112, and a single mask pattern (not illustrated) may be formed on the buffer layer 119. The buffer layer 119 and the passivation layer 117 may be sequentially etched off from the insulation layer 112 by an etching process using the mask pattern as an etching mask, to thereby simultaneously form the passivation pattern 113 and the buffer pattern 115 on the insulation layer 112. The passivation mask opening and the buffer mask opening may be formed into a single opening by a single photolithography process.

Figure 3H:
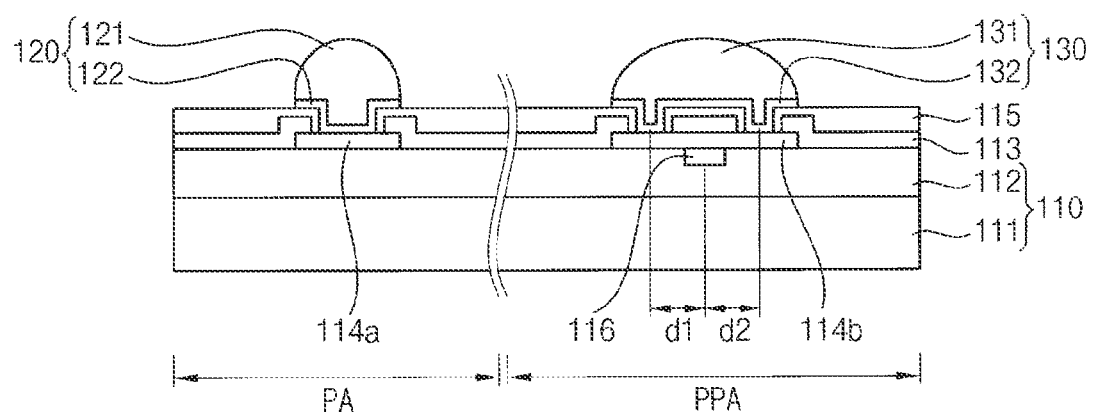

Referring to FIG. 3H, the first bump structure 120 may be formed on the buffer pattern 115 in the first area PA, and the second bump structure 130 may be formed on the buffer pattern 115 in the second area PPA.

In example embodiments of the present general inventive concept, a preliminary under-barrier metal (UBM) layer (not illustrated) may be formed on the buffer pattern 115 in accordance with a surface profile of the buffer pattern 15 including the first and second buffer openings 115a and 115b, and thus the sidewall and the bottom surface of the first and second buffer openings 115a and 115b may be covered with the preliminary UBM layer. Accordingly, the first and second electrode pads 114a and 114b may make direct contact with the preliminary UBM layer since the bottom surface of the buffer openings 115a and 115b may correspond to a top surface of the electrode pads 114. A third mask pattern (not illustrated) may be formed on the preliminary UBM layer in such a manner that the buffer openings 115a and 115b may be exposed through openings (not illustrated) of the third mask pattern. An electroplating process may be performed on the preliminary UBM layer using the third mask pattern as a plating mask, to thereby form a first preliminary bump structure (not illustrated) on the preliminary UBM layer corresponding to the first buffer opening 115a and a second preliminary bump structure (not illustrated) on the preliminary UBM layer corresponding to the second buffer opening 115b. The third mask pattern and the preliminary UBM layer underlying the third mask pattern may be removed from the buffer pattern 115, and thus the first preliminary bump structure and a first UBM layer 122 may be formed in the first area PA to fill up the first buffer opening 115a, and the second preliminary bump structure and a second UBM layer 132 may be formed in the second area PPA to fill up the second buffer opening 115b. A reflow process may be performed to the preliminary bump structures, to thereby form the first and second bump structures 120 and 130 shaped into a ball. Thus, the first bump structure 120 and the first UBM layer 122 may be formed on the first buffer opening 115a and the second bump structure 130, and the second UBM layer 132 may be formed on the second buffer opening 115b, to thereby manufacture the IC chip 100.

Although the example embodiments of the present general inventive concept discussed above disclose a center type IC chip in which the pad area PA may be arranged in a central portion of the substrate 111, an edge type IC chip in which the pad area PA may be arranged in a side portion of the substrate 111 may also be manufactured by the same method as described above.

While the example embodiments of the present general inventive concept discloses that the second bump structure 130 may make contact with the second electrode pad 114b at two contact points, the number of contact points and the contact configuration between the second bump structure 130 and the second electrode pad 114b may be varied in accordance with process conditions and device requirements of the IC device 110. That is, the second bump structure 130 may contact the second electrode pad 114b at a plurality of contact points.

According to example embodiments of the present general inventive concept of the method of manufacturing the IC chip, the bump structure may make contact with the electrode pad in the pseudo pad area of the IC chip such that the bump structure may be shifted from the underlying wiring line by a gap distance. Therefore, stress concentration to the wiring line may be sufficiently prevented, to thereby minimize the crack and the peeling on the wiring line in the IC chip. The electrode pad and the bump structure may make contact with one or more contact points, to thereby improve contact reliability of the bump structure.

Figure 4:
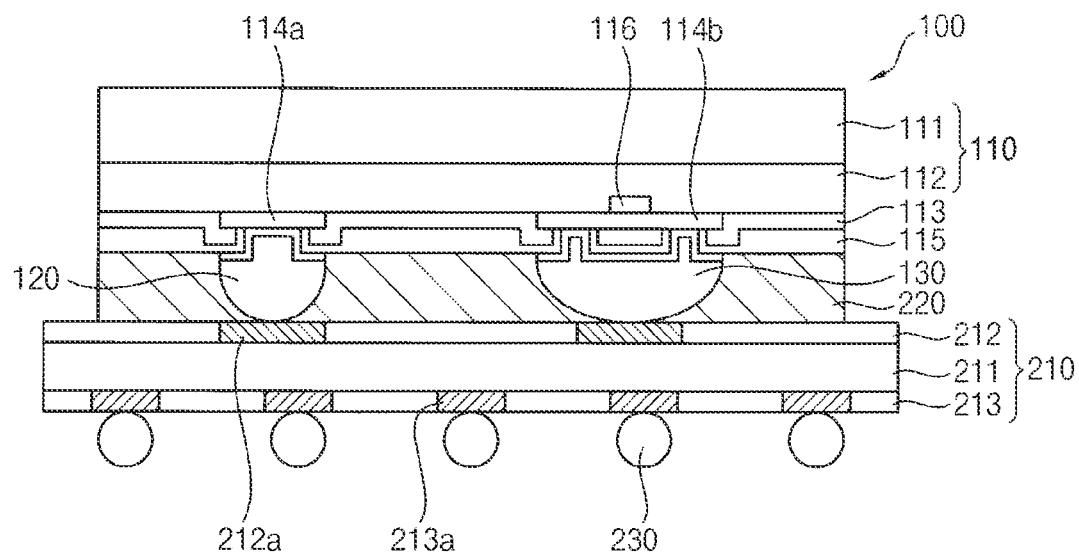
FIG. 4 is a cross-sectional view illustrating a flip chip package including the integrated circuit (IC) chip illustrated in FIG. 1 according to exemplary embodiments of the present general inventive concept.

FIG. 4 is a cross-sectional view illustrating a flip chip package including the integrated circuit (IC) chip illustrated in FIG. 1.

Referring to FIG. 4, a flip chip package 200 in accordance with example embodiments of the present general inventive concept may include an integrated circuit (IC) chip 100, a mounting substrate 210, an under-filling layer 220 and an exterior terminal 230.

The IC chip 100 may include substantially the same structure and configuration as the IC chip described in detail above with reference to FIG. 1, and thus any further detailed descriptions on the IC chip 100 will be omitted.

The mounting substrate 210 may be arranged under the IC chip 100. For example, the mounting substrate 210 may include an upper connection unit 212 that may be electrically connected to the first and second bump structures 120 and 130 of the IC chip 100, a lower connection unit 213 that may be electrically connected to the exterior terminal 230, and a body 211 to which the upper connection unit 212 and the lower connection unit 213 may be positioned at an upper portion and a lower portion, respectively. A mounting circuit pattern (not illustrated) may be arranged in the body 211, and thus the first and second bump structures 120 and 130 of the IC chip 100 may be electrically connected to the exterior terminal 230 through the mounting circuit in the body 211.

In example embodiments of the present general inventive concept, the mounting substrate 210 may include a printed circuit board (PCB), a glass substrate, and a flexible film. An upper contact pad 212a may be provided with the upper connection unit 212 and a lower contact pad 213a may be provided with the lower connection unit 213. The upper connection unit 212 and the lower connection unit 213 may include a photo solder resist (PSR).

The bump structures 120 and 130 of the IC chip 100 may contact with the upper contact pad 212a, and thus may be electrically connected to the mounting circuit pattern in the body 211. The mounting circuit pattern may be electrically connected to the lower connection unit 213 including the lower contact pad 213a making contact with the exterior terminal 230. The exterior terminal 230 may be electrically connected to the mounting circuit pattern. Electrical or electronic appliances may be installed to the exterior terminal 230. For example, the exterior terminal 230 may include a solder ball and the electrical appliances may include a logic circuit device or a memory module having the IC chip 100 and an electronic system having the logic circuit device or the memory module. The electronic system may include a computer system, a mobile phone, an MP3 player, a multimedia system, and any other electrical appliances that may carry out the exemplary embodiments of the present general inventive concept as disclosed herein.

Accordingly, the conductive structures in the cell and peripheral areas of the IC chip 100 may be electrically connected to the electronic and/or the electrical appliances in the medium of the bump structures 120 and 130, the mounting circuit pattern in the body 211, and the exterior terminal 230.

The second bump structure 130 may contact the second electrode pad 114b in the second area PPA of the IC chip 100 in such a configuration that the second bump structure 130 may be shifted from the underlying wiring line 116 by a gap distance. Stress concentration to the wiring line 116 may be sufficiently minimized and/or prevented, to thereby minimize the crack and the peeling on the wiring line 116 in the IC chip 100.

A gap space between the IC chip 100 and the mounting substrate 210 may be filled up with the under-filling layer 220 and thus the first and second bump structures 120 and 130 may be sufficiently protected from external shocks. Further, a sealing member (not illustrated) such as an epoxy molding compound (EMC) may be provided with the flip chip package and thus the IC chip 100 may be sealed from environments.

While the example embodiments of the present general inventive concept disclosed above describe a single chip package in which a single chip may be mounted on the mounting substrate, a plurality of chips may also be mounted onto a single mounting substrate to thereby form a multichip package by the above-disclosed method.

According to the example embodiments of the flip chip package of the present general inventive concept, the stress concentration to the wiring line may be minimized, even though internal stresses of the IC chip 100 may be varied according to the environmental variations, to thereby increase the reliability of the flip chip package.

Hereinafter a method of manufacturing the flip chip package illustrated in FIG. 4 may be described in detail with reference to FIGS. 5A to 5C.

Figure 5A:
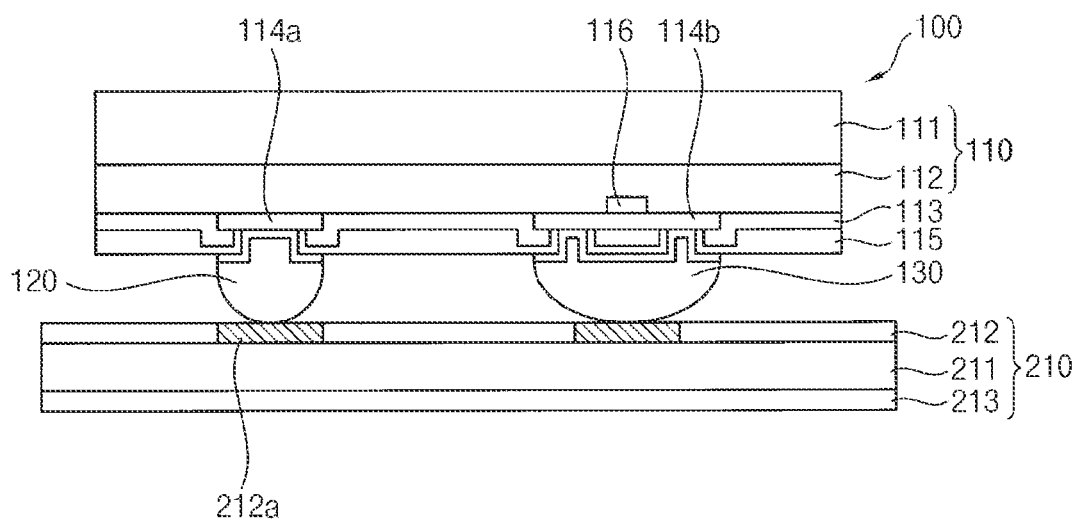
FIGS. 5A to 5C are cross-sectional views illustrating a method of manufacturing the flip chip package illustrated in FIG. 4 according to exemplary embodiments of the present general inventive concept.
Figure 5B:
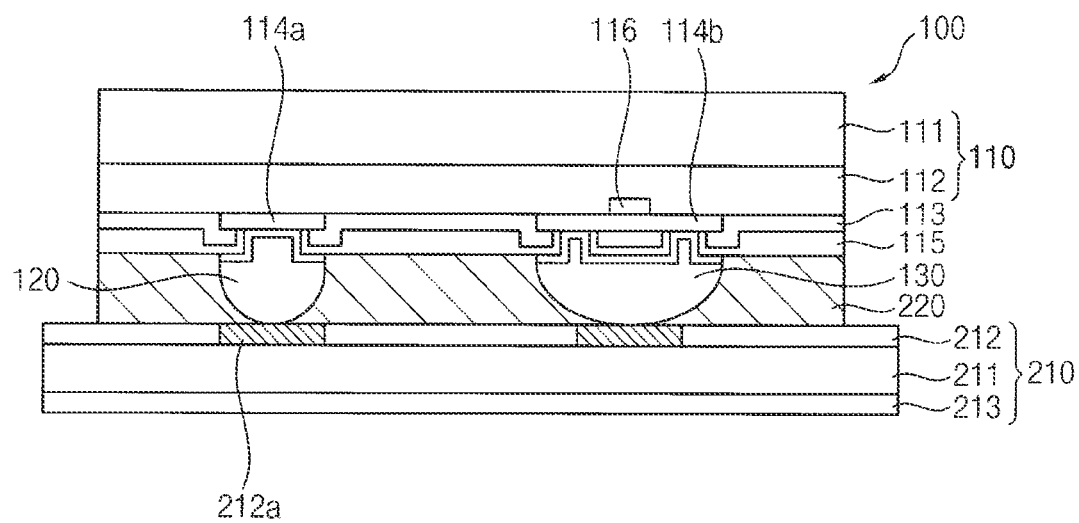
Figure 5C:
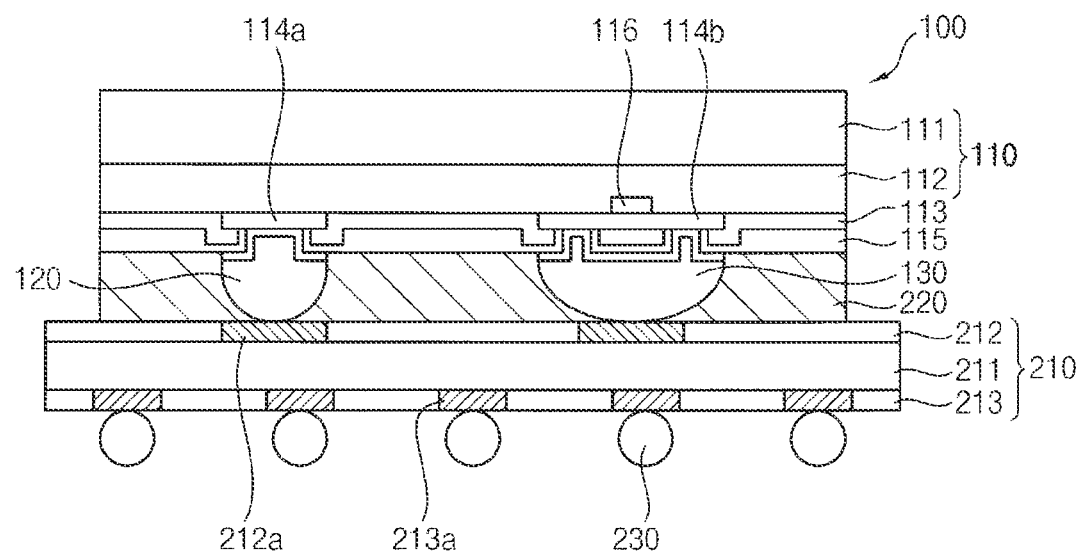

FIGS. 5A to 5C are cross-sectional views illustrating processing steps of a method of manufacturing the flip chip package illustrated in FIG. 4.

Referring to FIG. 5A, the IC chip 100 may be mounted on the mounting substrate 210. For example, the bump structures 120 and 130 of the IC chip 100 may be aligned with the upper contact pads 212a, and a thermal bonding process may be performed to the IC chip 100 and the mounting substrate 210. Thus, the bump structures 120 and 130 of the IC chip 100 may be bonded to the upper contact pads 212a, respectively.

Referring to FIG. 5B, the gap space between the bump structures 120 and 130 and the mounting substrate 210 may be filled up with the under-filling layer 220, and thus the bump structures 120 and 130 may be isolated from surroundings. Then, a heat treatment may be performed to the under-filling layer 220, to thereby harden the under-filling layer 220. When the under-filing layer 220 may be hardened, the bump structures 120 and 130 and the upper contact pads 212a may also be hardened together with the under-filling layer 220, to thereby reinforce an adhesion between the bump structures and the upper contact pads.

Referring to FIG. 5C, the exterior terminals 230 may be bonded to the lower contact pads 213a of the mounting substrate 210. Thereafter, the IC chip 100 may be sealed from surroundings by a sealing member (not illustrated), to thereby manufacture the flip chip package 200.

Therefore, although the internal stresses of the IC chip 100 may be increased due to the mounting substrate and the external appliances connected to the exterior terminal 230, the internal stresses may be minimized and/or prevented from being concentrated to the wiring line of the IC chip.

According to example embodiments of the present general inventive concept, the bump structure may make contact with the electrode pad in cell and peripheral areas of the IC chip such that the bump structure may be shifted from the underlying wiring line by a gap distance. Therefore, although the internal stresses of the IC chip may be varied according to external impacts caused by the installation of external electronic appliances, bonding of the IC chip and the mounting substrate and the formation of the bump structure, the internal stresses may be minimized and/or prevented from being concentrated to the wiring line, to thereby minimize the crack and the peeling on the wiring line in the IC chip. The electrode pad and the bump structure may make contact with a plurality of contact points, to thereby improve contact reliability of the bump structure. Accordingly, the product reliability of the IC chip and the flip chip package including the IC chip may be increased and/or improved by the shift of the bump structure from the wiring line in the pseudo pad area (PPA).

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. An integrated circuit (IC) chip comprising:
an integrated circuit (IC) device including a plurality of conductive structures stacked on a substrate and a plurality of wiring lines electrically connected to the plurality of the conductive structures;
an electrode pad arranged on the IC device and electrically communicating with the conductive structures through at least one of the plurality of wiring lines, the electrode pad including a first pad to which at least one of the wiring lines is extended and a second pad making direct contact with the at least one of the wiring lines that is partially positioned under the second pad;
a passivation pattern covering the electrode pad and including a first passivation opening through which the first pad is partially exposed and at least a second passivation opening through which the second pad is partially exposed, the second passivation opening being horizontally apart from the wiring line positioned under the second pad; and
a bump structure arranged on the passivation pattern and including a first bump structure making contact with the first pad through the first passivation opening and a second bump structure making contact with the second pad through the second passivation opening such that the second bump structure is horizontally apart from the underlying wiring line,
wherein the second passivation opening includes a first split passivation opening apart from at least one of the plurality of wiring lines by a first distance in a first direction and a second split passivation opening apart from the at least one of the plurality of wiring lines by a second distance in a second direction opposite to the first direction, so that the first and the second split passivation openings are arranged on the second pad symmetrical to each other with respect to the at least one of the plurality of wiring lines, and
wherein the first pad has no wiring line directly under it.

2. The integrated circuit (IC) chip of claim 1, wherein the wiring lines include a plurality of power lines to apply a driving power to the conductive structures and a plurality of ground lines to electrically ground the wiring lines.

3. The integrated circuit (IC) chip of claim 1, further comprising:
a buffer pattern arranged on the passivation pattern, the buffer pattern including a first buffer opening through which the first pad is partially exposed and at least a second buffer opening through which the second pad is partially exposed.

4. The integrated circuit (IC) chip of claim 3, wherein the buffer pattern comprises one of nitride, polyimide and epoxy resin.

5. The integrated circuit (IC) chip of claim 1, wherein the bump structure includes a conductive bump to make contact with a mounting substrate and a under-barrier metal (UBM) layer interposed between the conductive bump and the electrode pad and to bond the conductive bump to the electrode pad.

6. The integrated circuit (IC) chip of claim 5, wherein the UBM layer includes a bi-layer having a barrier layer to minimize diffusion of the bump structure into the electrode pad and a metal layer to increase a bonding force between the barrier layer and the bump structure.

7. The integrated circuit (IC) chip of claim 5, wherein the UBM layer includes a nickel layer coated on the electrode pad by an electroless plating process.

8. An integrated circuit (IC) chip comprising:
an integrated circuit (IC) device including a plurality of conductive structures stacked on a substrate and a plurality of wiring lines electrically connected to the plurality of the conductive structures;
an electrode pad arranged on the IC device and electrically communicating with the conductive structures through at least one of the plurality of wiring lines, the electrode pad including a first pad to which at least one of the wiring lines is extended and a second pad making direct contact with the at least one of the wiring lines that is partially positioned under the second pad;
a passivation pattern covering the electrode pad and including a first passivation opening through which the first pad is partially exposed and at least a second passivation opening through which the second pad is partially exposed, the second passivation opening being horizontally apart from the wiring line positioned under the second pad; and
a bump structure arranged on the passivation pattern and including a first bump structure making contact with the first pad through the first passivation opening and a second bump structure making contact with the second pad through the second passivation opening such that the second bump structure is horizontally apart from the underlying wiring line,
wherein the second passivation opening includes a first split passivation opening apart from at least one of the plurality of the wiring lines by a first distance in a direction and a second split passivation opening apart from the wiring line by a second distance in the direction, so that the first and second split passivation openings are arranged on the second pad at a same side of the wiring line,
wherein the first pad has no wiring line directly under it.

9. A flip chip package comprising:
a mounting substrate including a body in which a mounting circuit pattern is arranged, an upper contact pad on an upper surface of the body and a lower contact pad on a lower surface of the body, the mounting circuit pattern being electrically connected to both of the upper and lower contact pad;
an integrated circuit (IC) chip to make contact with the upper contact pad of the mounting substrate through a bump structure, the bump structure including a first bump structure making contact with a first electrode pad arranged in a pad area and a second bump structure making contact with a second electrode pad in a pseudo pad area in such a configuration that a wiring line is positioned under and in contact with the second electrode pad, and the second bump structure is horizontally apart from the underlying wiring line, wherein the wiring line extends to the first electrode pad from the pseudo pad area;
an exterior terminal connected to the lower contact pad; and
a under-filling layer to fill a gap space between the mounting substrate and the IC chip,
wherein the first electrode pad has no wiring line directly under it.

10. An integrated circuit (IC) chip, comprising:
an IC device including at least a substrate, an insulation layer, and a wiring line, the IC device having a first area and a second area;
a first electrode pad disposed on the insulation layer of the IC device in the first area such that the wiring line extends to the first electrode pad from the second area;

a first bump structure disposed on at least a portion of the first electrode pad so as to make contact with the first electrode pad;

a second electrode pad disposed on the insulation layer of the IC device in the second area such that the second electrode pad makes direct contact with the wiring line positioned under the second electrode pad; and a second bump structure disposed on at least a portion of the second electrode pad so as to make contact with the second electrode pad at a contact point apart from the underlying wiring line, wherein the first electrode pad has no wiring line directly under it.

11. An integrated circuit (IC) chip, comprising:

an IC device including at least a substrate, an insulation, layer, and a wiring line, the IC device having a first area and a second area;

a first electrode pad disposed on the insulation layer of the IC device in the first area such that the wiring line extends to the first electrode pad from the second area;

a first bump structure disposed on at least a portion of the first electrode pad so as to make contact with the first electrode pad;

a second electrode pad disposed on the insulation layer of the IC device in the second area such that the second electrode pad makes direct contact with the wiring line positioned under the second electrode pad; and a second bump structure disposed on at least a portion of the second electrode pad so as to make contact with the second electrode pad at a pair of contact points symmetrical with each other with respect to the wiring line positioned under the second electrode pad, wherein the first electrode pad has no wiring line directly under it.

* * * * *